United States Patent
Tang

(10) Patent No.: US 7,445,995 B2
(45) Date of Patent: Nov. 4, 2008

(54) FLASH MEMORY STRUCTURE AND FABRICATION METHOD THEREOF

(75) Inventor: Ming Tang, Hualien (TW)

(73) Assignee: Himax Technologies, Inc.., Tainan County (TW)

( * ) Notice: Subject to any disclaimer, the term of this patent is extended or adjusted under 35 U.S.C. 154(b) by 13 days.

(21) Appl. No.: 11/531,954

(22) Filed: Sep. 14, 2006

(65) Prior Publication Data

US 2007/0010057 A1   Jan. 11, 2007

Related U.S. Application Data

(62) Division of application No. 10/981,653, filed on Nov. 5, 2004, now abandoned.

(30) Foreign Application Priority Data

Aug. 12, 2004 (TW) .............................. 93124229 A

(51) Int. Cl.
*H01L 21/336* (2006.01)
(52) U.S. Cl. ................................ 438/257; 257/E21.179
(58) Field of Classification Search .................. 438/257
See application file for complete search history.

(56) References Cited

U.S. PATENT DOCUMENTS

| | | | |
|---|---|---|---|
| 5,495,441 A | 2/1996 | Hong | |
| 6,017,795 A | 1/2000 | Hsieh et al. | |
| 6,821,849 B2 | 11/2004 | Chang et al. | |
| 6,894,339 B2 | 5/2005 | Fan et al. | |
| 7,049,652 B2 * | 5/2006 | Mokhlesi et al. | ............ 257/315 |
| 2002/0070405 A1 | 6/2002 | Suglyama et al. | |
| 2004/0166631 A1 | 8/2004 | Hurley | |

* cited by examiner

*Primary Examiner*—W. David Coleman

(57) ABSTRACT

A flash memory structure comprises a semiconductor substrate, a source region, a drain region, a first insulating dielectric layer, a floating gate, a second insulating dielectric layer, and a control gate. The semiconductor substrate has a first top surface and a second top surface that is lower than the first top surface. The source region and the drain region are respectively in the second top surface and the first top surface of the semiconductor substrate, and the semiconductor substrate connecting the source region and the drain region is a vertical channel region. The whole channel region is covered by the first insulating dielectric layer, the floating gate, the second insulating dielectric layer, and the control gate in turn.

9 Claims, 3 Drawing Sheets

FLASH MEMORY STRUCTURE AND FABRICATION METHOD THEREOF

RELATED APPLICATIONS

The present application is a divisional application of U.S. patent application Ser. No. 10/981,653, filed Nov. 5, 2004, and is based on, and claims priority from, Taiwan Application Serial Number 93124229, filed Aug. 12, 2004, the disclosure of which is hereby incorporated by reference herein in its entirety.

BACKGROUND OF THE INVENTION

1. Field of Invention

The invention pertains to flash memory and, in particular, to a flash memory structure that has a vertical channel region with multiple gates and the fabrication method thereof.

2. Related Art

Flash memory is one kind of non-volatile memory. It is used to store data in memory unit. Not only can it maintain the memory of data without being charged, it further has the feature of multiple writing/rewriting. Therefore, it has rapidly developed to become the new generation memory device in recent years.

However, all the current flash memory structures have the problem of no scaling. Particularly when the sizes of electronic products and semiconductor devices become smaller, the fabrication of flash memory faces the bottleneck of being unable to satisfy the requirement of small device sizes and good device properties at the same time.

Since the source region, the drain region, and the channel region in the device are located on the same plane, variations in the device size will directly affect the channel length, which in turn forms a restriction in the device size definition.

The conventional flash memory structure is stacked gate flash memory, whose structure is similar to electrically erasable and programmable ROM (EEPROM). It has a control gate and a floating gate stacked on the device channel. It achieves the programming purpose by injecting hot carriers from the drain into the floating gate. Although the stacked gate flash memory has the advantage of a simpler structure for minimizing the device size, the hot carrier injection efficiency is very low. As the device size shrinks, not only is the channel length shortened, the area of the floating gate and the control gate stacked on the channel also has to decrease. This reduces the capacitance between the floating gate and the control gate, causing increase in the operating voltage.

To increase the hot carrier injection rate, most people add gate units. For example, in one type of source injection flash memory, there are three gate units. In addition to the stacked control gate and the floating gate, an injection gate is further provided above the source to induce the injection of hot carriers from the source to the floating gate. Although this type of flash memory can increase the hot carrier injection efficiency with the installation of the injection gate, the addition injection gate results in a larger device size.

There is also a split-gate flash memory structure, which has the same advantage as the source injection flash memory. By increasing the size of the control gate, the coupling ratio between the control gate and the floating gate and the hot carrier injection efficiency can be simultaneously increased, thereby lowering the operating voltage. Nonetheless, it also has a larger size due to the control gate design.

Therefore, how to keep the desired flash memory characteristics while at the same time minimizing the device size is an important research trend in the field. Moreover, as the device size becomes smaller, the punch-through or breakdown phenomenon may happen due to the short carrier channel. This will damage the device and reduce the device reliability.

SUMMARY OF THE INVENTION

An objective of the invention is to provide a flash memory structure and the fabrication method thereof. A device with a vertical channel region is provided to both keep the desired device characteristics and increase the scaling ability of the device. Moreover, the gate structure covers the vertical channel using multiple surfaces, forming a multiple-surface gate. This can increase the operating efficiency of the flash memory.

A flash memory structure and the fabrication method thereof are proposed according to the above-mentioned objective. According to an embodiment of the invention, the flash memory structure includes at least a semiconductor substrate, a source region, a drain region, a first insulating dielectric layer, a floating gate, a second insulating dielectric layer, and a control gate. The semiconductor substrate has a first top surface and a second top surface, with the former higher than the latter. The source region and the drain region are located in the second top surface and the first top surface of the semiconductor substrate, respectively. The semiconductor substrate connecting the source region and the drain region is a vertical channel, and the vertical channel further contains an L-shaped three-dimensional structure.

The first insulating dielectric layer is formed on the vertical channel of the semiconductor substrate to completely cover it. The floating gate, the second insulating dielectric layer and the control gate cover the first insulating dielectric layer in sequence. Due to the here-dimensional structure of the vertical channel region, the floating gate can surround the vertical channel region in many faces. In a preferred embodiment, the floating gate surrounds three side surfaces of the vertical channel region. In another embodiment, the floating gate further covers the top surface of the vertical channel region. The first insulating dielectric layer is a tunneling oxide layer. The floating gate may be a polysilicon layer or a silicon nitride layer. The control gate is a polysilicon layer.

According to another embodiment, the flash memory fabrication method includes the step of patterning a semiconductor substrate to remove part of the semiconductor substrate to a depth, forming island blocks in the semiconductor substrate. A trench is thus formed between each two island blocks. The top surface of the island block is the first top surface of the semiconductor substrate. The trench is the second top surface of the semiconductor substrate.

Afterwards, the first insulating dielectric layer is formed on the semiconductor substrate, covering the island blocks and the trenches at the same time. A charge storage pattern made from a charge storage layer is formed on the first insulating dielectric layer. The second insulating dielectric layer and the conductive layer are formed in sequence on the charge storage pattern to cover it.

After the second insulating dielectric layer and the conductive layer are formed, they along with the charge storage layer are further patterned to form at least a gate stack unit. The first insulating dielectric layer in part of the trenches and that in part of the island blocks are exposed on both sides of the gate stack unit. In particular, the gate stack unit covers the range of the three side surfaces and/or the top surface of some island blocks, and is positioned on part of the trenches, and the island blocks.

Afterwards, ion implantation is performed on the first top surface and the second top surface of the semiconductor substrate, forming the source region and the drain region, respectively.

The charge storage layer and the conductive layer mentioned above are used as the floating gate and the control gate, respectively. The semiconductor substrate connecting the source region and the drain region is a vertical channel region, whose three side surfaces and/or top surface are covered by the gate stack unit. In particular, the vertical channel region has an L-shaped three-dimensional structure.

From the above description of the disclosed flash memory structure, one sees that variations in the channel length does not have any effect on the device size due to the design of the vertical channel region. That is, the channel length and the device size are independent. When scaling the device, the channel length is not constrained. The device thus made can still keep good properties. Moreover, the contact area between the gate and the channel region is not restricted by the change in the device size. Even when the device size shrinks, an appropriate channel length can be maintained to avoid the punch-through or breakdown phenomenon, increasing the reliability and quality of devices.

The disclosed structure covers the vertical channel region in many faces to form a multiple-surface gate configuration. Therefore, not only can it effectively increase the contact area between the control gate, the floating gate and the channel region, but also increases the coupling ratio and the device operating capability. The capacitance between the control gate and the floating gate can be increased to lower the operating voltage.

Besides, using the L-shaped three-dimensional structure in the vertical channel region, an L-shaped carrier path is formed to increase the hot carrier injection rate during the programmable operation of the flash memory, increasing the operating speed and performance of the device.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

The present invention will be apparent from the following detailed description, which proceeds with reference to the accompanying drawings, wherein the same references relate to the same elements.

The invention provides a flash memory structure and the fabrication method thereof. Using the design of a vertical channel region, the length of the carrier channel is not affected by variations in the device size. Therefore, one can scale the device without influencing the device characteristics. The disclosed flash memory further has the configuration of multiple-surface gate surrounding the carrier channel. This is especially helpful in increasing the operating characteristics of the flash memory and the coupling ratio between the control gate and the floating gate. In the following, we use specific embodiments to explain the disclosed method.

FIGS. 1A to 1D show schematic cross-sectional views of a fabrication method for a flash memory structure.

Figure 1A:
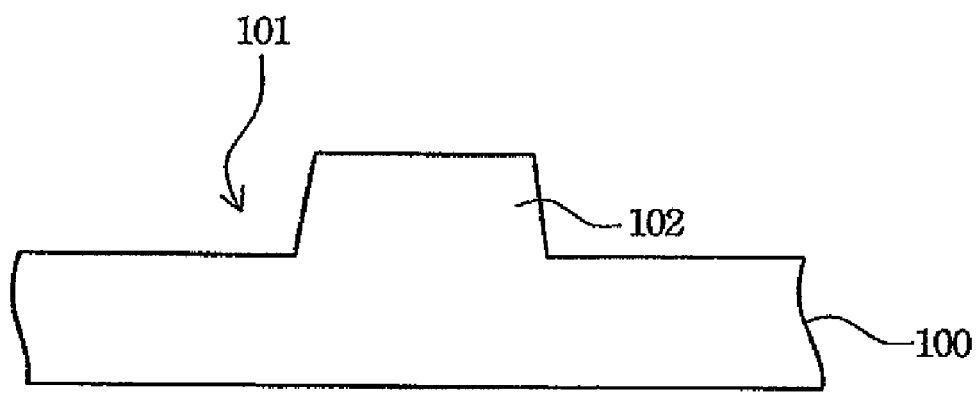
FIGS. 1A to 1D are schematic cross-sectional views of a method for making a flash memory structure in accordance with embodiments of the invention.

In FIG. 1A, a p-type well is formed on a semiconductor substrate 100. Its formation method includes performing ion implantation and patterning the semiconductor substrate 100, defining the electrical property of the semiconductor substrate 100 and the positions of trenches 101 and island blocks 102 thereon. One choice of the material of the semiconductor substrate 100 is silicon (Si).

Figure 1B:
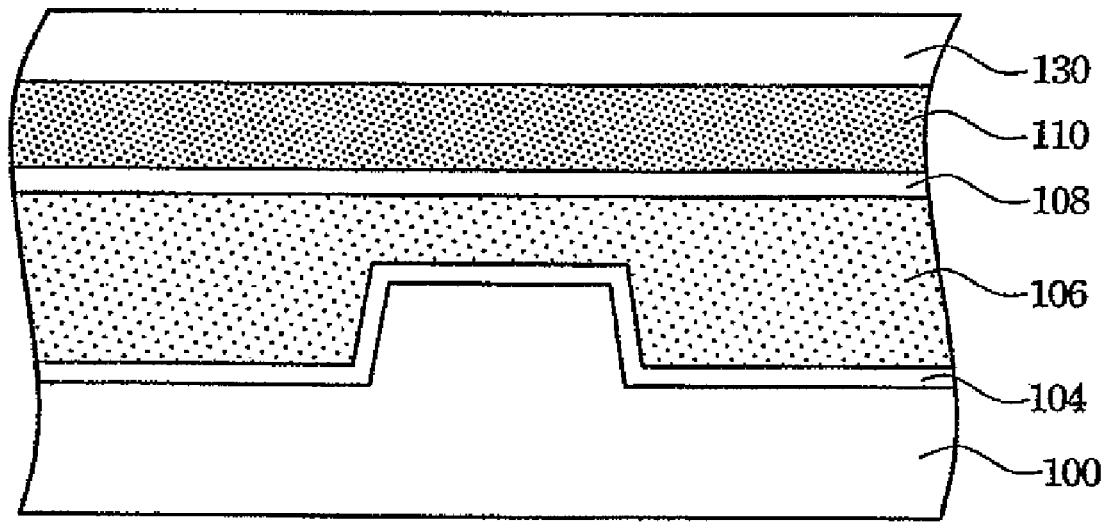

In FIG. 1B, a tunneling oxide layer 104 is first formed on the semiconductor substrate 100, followed by forming a charge storage layer 106 on the tunneling oxide layer 104, filling the trenches 101. The charge storage layer 106 is used as a floating gate. The tunneling oxide layer 104 functions as an insulating dielectric layer between the floating gate and the semiconductor substrate 100. One choice of the material of the tunneling oxide layer 104 is silicon dioxide ($SiO_2$). The charge storage layer 106 may be a polysilicon layer or a silicon nitride layer.

The charge storage layer 106 is then patterned, forming a charge storage circuit pattern parallel to the cross-sectional direction. Afterwards, an inter-layer dielectric layer 108, a conductive layer 110, and a nitride covering layer 130 are formed in sequence on the charge storage layer 106, covering the charge storage circuit pattern at the same time. In particular, the conductive layer 110 serves as a control gate. The inter-layer dielectric layer 108 is an insulating dielectric layer between the control gate and the floating gate. The material of the inter-layer dielectric layer 108 may be silicon dioxide or a stack layer consisting of oxide/nitride/oxide (O/N/O). The conductive layer 110 may be a polysilicon layer.

Figure 1C:
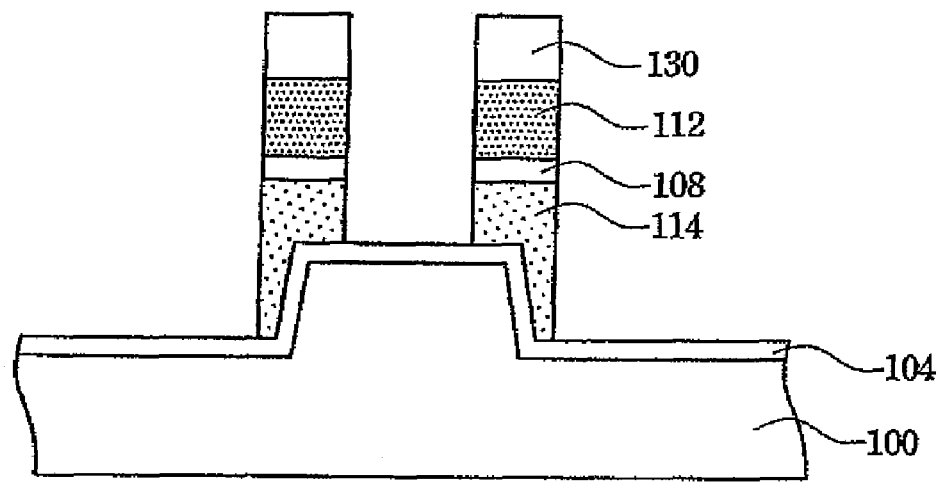

With reference to FIG. 1C, a conventional photolithography and etching process is employed to pattern the charge storage layer 106, the inter-layer dielectric layer 108, the conductive layer 110, and the nitride covering layer 130, defining the gate stack unit. The gate stack unit is composed of a control gate unit 112, an inter-layer dielectric layer 108, and a floating gate unit 114.

Figure 1D:
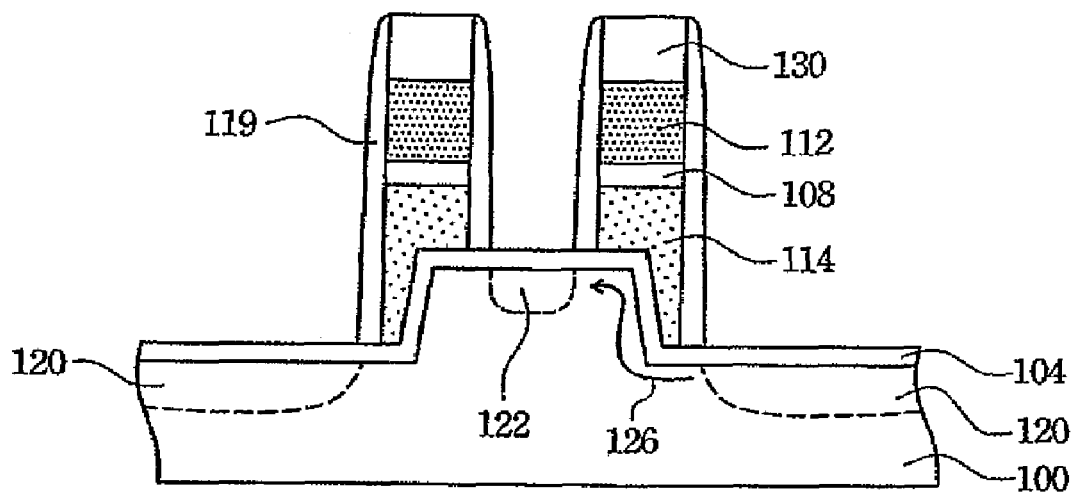

After defining the control gate unit 112 and the floating gate unit 114, a sidewall spacer 119 is formed on both sides of the gate stack unit to maintain the electrical isolation among the gate units, as shown in FIG. 1D. The material of the sidewall spacer 119 may be silicon nitride.

Afterwards, photo resist and a photolithography process are used to define a source opening and a drain opening. For example, a photo resist layer is first formed on the semiconductor substrate 100. Then the photolithography process is performed to simultaneously or respectively define the source opening and the drain opening. The photo resist layer inside the openings is removed later.

An ion implantation step is performed on the semiconductor substrate 100 in the source opening and the drain opening, forming an n-type source region 120 and an n-type drain region 122. Finally, the residual photo resist layer is removed. This completes the procedure of making a flash memory structure with a vertical channel region. If subsequent processes for devices further proceed, such as forming an insulating dielectric layer and forming conductive metal in the source opening and the drain opening, one can make a more complete flash memory control unit. In particular, when a carrier moves from the source region 120 to the drain region 122, a three-dimensional L-shaped channel (indicated by the arrow 126) is formed.

Figure 2:
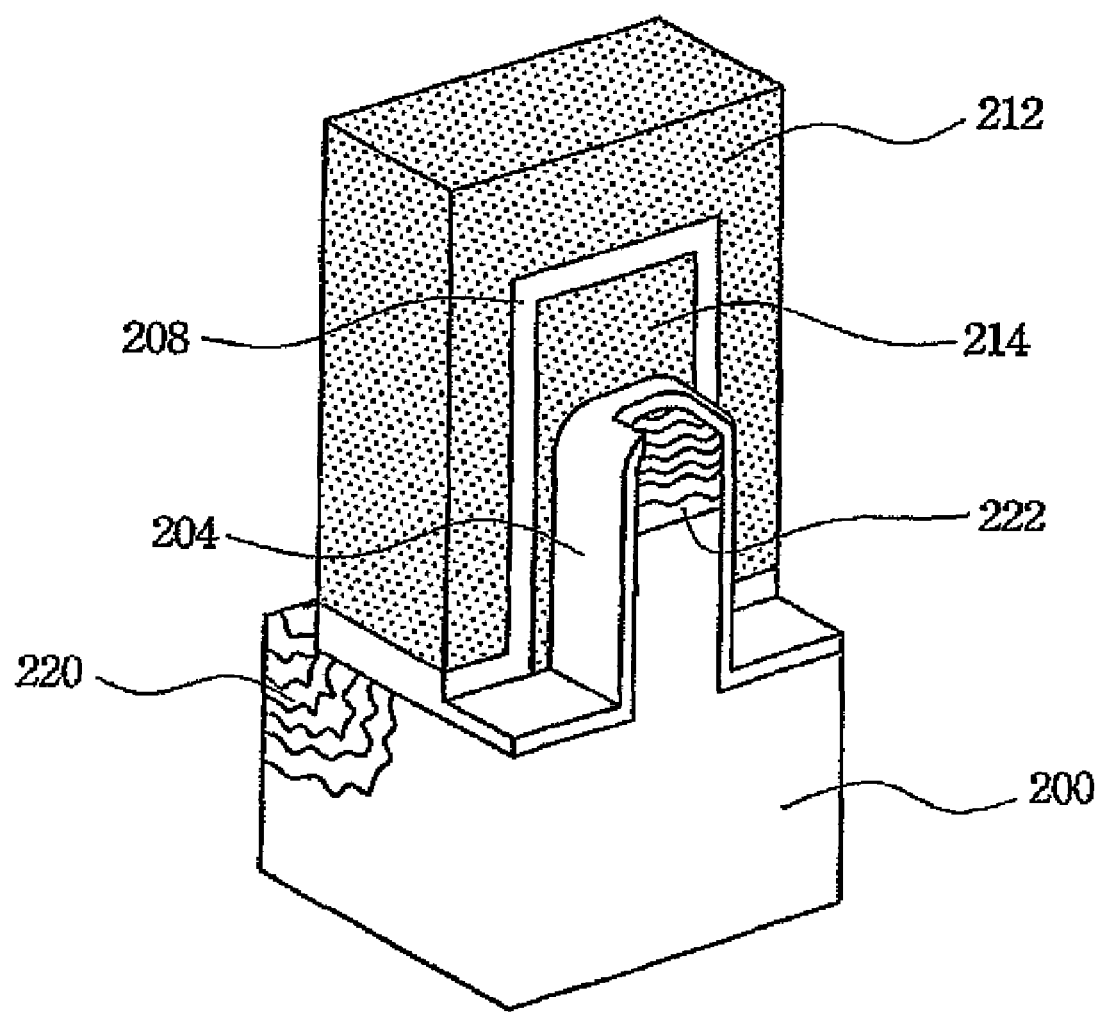
FIG. 2 is a schematic cross-sectional view of a flash memory structure according to a preferred embodiment of the invention.

The three-dimensional flash memory structure formed using the described method is shown in FIG. 2. The programming of the flash memory is done with the carriers moving from the source region 220 to the drain region 222 on the semiconductor substrate 200. At the drain region 222, the carriers penetrate through the tunneling oxide layer 204 and reach the floating gate 214 in the channel hot carrier injection (CHEI) mode. The path traveled by the carriers from the source region 220 to the drain region 222 is the carrier channel. The control gate 212 and the floating gate 214 are separated by an inter-layer dielectric layer 208.

Since the carrier channel in the invention is a three-dimensional vertical structure, which is different from the horizontal channels in the prior art, the floating gate 214 and the control gate 212 form a multiple-surface surrounded channel region. Thus, a flash memory structure in accordance with the invention has multiple-surface gate controls. In a preferred embodiment of the invention, the floating gate 214 and the control gate 212 surround three side surfaces of the channel region. In another embodiment, the floating gate 214 and the control gate 212 surround three side surfaces and the top surface of the channel region.

As the disclosed flash memory has a vertical carrier channel, variations in the length of the channel only affect the height in the longitudinal direction without influencing the device size. That is, the channel length and the device size are independent. As a result, the channel size is not restricted by scaling the device.

Besides, due to the three-dimensional structure of the vertical channel, the carriers first move upward from the source region 220 and then turn horizontally toward the drain region 222 at around the drain region 222 when moving from the source region 220 to the drain region 222. Therefore, a three-dimensional L-shaped channel is formed. In this case, the carrier density at the turning point of the L-shaped channel is higher, rendering a higher hot carrier injection rate. This improves the overall carrier injection efficiency of the device.

From the above-mentioned embodiments of the invention, one sees that the disclosed flash memory structure and the fabrication method thereof diminish the restriction in the device size by the channel length due to the vertical channel design. Therefore, the device size can be scaled without sacrificing the desired device characteristics. The contact area between the gate and the channel region is not restricted by the device size.

Furthermore, even when the device size shrinks, an appropriate channel length is maintained to prevent the punch-through or breakdown phenomenon. Thus, the device reliability and quality is assured.

As a result of the structure design in the invention, the control gate and the floating gate that cover the channel form a multiple-surface gate style. Therefore, the contact area between the control gate, the floating gate and the channel region can be effectively increased without adding more gates. This increases the coupling ratio and the device operating capability. Hence, the capacitance between the control gate and the floating gate is increased to reduce the operating voltage and to enhance the device performance without affecting the device size.

In addition, using the structure of a vertical channel region, the L-shaped carrier path speeds up the hot carrier injection rate during the operation of the flash memory, further enhancing the operating speed and performance of the device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of fabricating a flash memory structure, comprising the steps of:
  patterning a semiconductor substrate to remove part of the semiconductor substrate to a predetermined depth with a plurality of island blocks formed in the semiconductor substrate and a trench formed between two adjacent island blocks, wherein a top surface of each of the island blocks is a first top surface of the semiconductor substrate and a surface of the trench is a second top surface of the semiconductor substrate;
  forming a first insulating dielectric layer on the semiconductor substrate to simultaneously cover the island blocks and the trench;
  forming a charge storage layer pattern on the first insulating dielectric layer such that the trench is filled with the charge storage layer pattern;
  forming a second insulating dielectric layer on the charge storage layer pattern to cover the charge storage layer pattern;
  forming a conductive layer on the second insulating dielectric layer to cover the second insulating dielectric layer;
  forming a nitride covering layer on the conductive layer to cover the conductive layer;
  patterning the conductive layer, the second insulating dielectric layer and the charge storage layer pattern to form a gate stack unit such that part of the first insulating dielectric layer in the trench and part of the first insulating dielectric layer on the island block are exposed, wherein the gate stack unit covers at least part of the three side surfaces of the island block, and is positioned on part of the trench and part of the island block; and
  implanting ions into part of the first top surface and the second top surface of the semiconductor substrate to form respectively a drain region and a source region.

2. The method of claim 1, wherein the first insulating dielectric layer comprises a tunneling oxide layer.

3. The method of claim 1, wherein the conductive layer comprises a polysilicon layer.

4. The method of claim 1, wherein the charge storage layer pattern is a polysilicon layer or a silicon nitride layer.

5. The method of claim 1, wherein the charge storage layer pattern is used as a floating gate and the conductive layer is used as a control gate.

6. The method of claim 1, further comprising a step of forming a sidewall spacer on one side of the gate stack unit before the step of implanting the ions.

7. The method of claim 1, wherein the semiconductor substrate connecting the source region and the drain region comprises a vertical channel region.

8. The method of claim 7, wherein the vertical channel region comprises an L-shaped three-dimensional structure.

9. The method of claim 7, wherein the gate stack unit formed from the conductive layer, the second insulating dielectric layer and the charge storage layer pattern completely covers the vertical channel path.

* * * * *

UNITED STATES PATENT AND TRADEMARK OFFICE
CERTIFICATE OF CORRECTION

PATENT NO. : 7,445,995 B2  Page 1 of 1
APPLICATION NO. : 11/531954
DATED : November 4, 2008
INVENTOR(S) : Ming Tang It is certified that error appears in the above-identified patent and that said Letters Patent is hereby corrected as shown below:

On the title page, the Assignee information should read as follows:

(73) Assignee: PROMOS TECHNOLOGIES, INC.  HSINCHU, TAIWAN R.O.C.

Signed and Sealed this

Twenty-seventh Day of October, 2009

David J. Kappos
*Director of the United States Patent and Trademark Office*